United States Patent [19]

Kim

[11] Patent Number: 5,706,480

[45] Date of Patent: Jan. 6, 1998

[54] MEMORY DEVICE AND METHOD FOR PROCESSING DIGITAL VIDEO SIGNAL

[75] Inventor: Dae Sik Kim, Seoul, Rep. of Korea

[73] Assignee: LG Semicon Co., Ltd., Chungcheongbuk-do, Rep. of Korea

[21] Appl. No.: 598,295

[22] Filed: Feb. 8, 1996

[30] Foreign Application Priority Data

Oct. 4, 1995 [KR] Rep. of Korea ............... 33871/1995

[51] Int. Cl.[6] ..................................................... G06F 12/06
[52] U.S. Cl. .......................... 395/517; 395/509; 395/521
[58] Field of Search ............................. 395/517, 521, 395/524, 509; 365/230.01, 222; 375/94

[56] References Cited

U.S. PATENT DOCUMENTS

| | | | |
|---|---|---|---|
| 4,768,157 | 8/1988 | Chauvel et al. | 395/517 |
| 4,912,658 | 3/1990 | Sfarti et al. | 395/517 |
| 4,920,504 | 4/1990 | Sawada et al. | 395/517 |
| 5,276,710 | 1/1994 | Iwasaki | 375/94 |
| 5,430,684 | 7/1995 | Kim et al. | 365/230.01 |
| 5,546,459 | 8/1996 | Sih et al. | 379/411 |

*Primary Examiner*—Raymond J. Bayerl
*Assistant Examiner*—Cao H. Nguyen
*Attorney, Agent, or Firm*—Morgan, Lewis & Bockius LLP

[57] ABSTRACT

A memory device for processing a block of digital video signal data comprises a random block access (RBA) controller for generating a system control signal to thereby vary a size of the block, an address generator for receiving external address signals according to the system control signal generated by the RBA controller to thereby generate internal addresses corresponding to the size of the block, a memory cell array to which digital video signal data is written or from which digital video signal data is read according to the internal addresses generated by the address generator, a transmission controller for controlling the transmission of digital video signal data stored in the memory cell array corresponding to the internal addresses generated by the address generator, an input/output unit for receiving or sending digital video signal data outside the memory device under the control of the RBA controller and the transmission controller.

21 Claims, 6 Drawing Sheets

| BLOCK SIZE | | 16×16 BITS | 8×8 BITS | 4×4 BITS | 2×2 BITS |
|---|---|---|---|---|---|
| BLOCK SIZE CONTROL SIGNAL | EXTERNAL SIGNAL | /S0,/S1 | S0,/S1 | /S0,S1 | S0,S1 |
| | INTERNAL SIGNAL D0-D3 | D0=0 D1=1 D2=1 D3=1 | D0=1 D1=0 D2=1 D3=1 | D0=1 D1=1 D2=0 D3=1 | D0=1 D1=1 D2=1 D3=0 |
| | XRE | XR15 | XR7 | XR3 | XR1 |
| FREQUENCY | | f0=SCx | f1=2f0 | f2=4f0 | f3=8fc |

1

MEMORY DEVICE AND METHOD FOR PROCESSING DIGITAL VIDEO SIGNAL

BACKGROUND OF THE INVENTION

1. Field of the Invention

The present invention relates to a memory device, and more particularly, to a memory device for processing a digital video signal.

2. Discussion of the Related Art

A memory device is used in reading or writing digital video signal data in block units when a digital video signal is processed. As shown in FIG. 1, a conventional memory device for processing a digital video signal usually comprises a random block access (RBA) controller 100, an address generator 101, a memory cell array 102, a transmission controller 103, and an input/output means 104. The structure of this memory device will now be explained.

The RBA controller 100 generates a control signal according to externally supplied control signals /RAS$_x$, /CAS$_x$, /WE, /DT, SC$_x$, and RBA. The address generator 101 receives row and column address signals generated from an external central processing unit (CPU) (not shown). Using such row and column address signals as starting addresses, the address generator 101 then continuously generates internal row and column addresses corresponding to the size of a block according to the control signal of the RBA controller 100. The memory cell array 102 includes memory cells to which data is written or from which data is read according to the internal row and column addresses produced by the address generator 101. The transmission controller 103 controls the transmission of data stored in the memory cell array 102 under the control of the RBA controller 100 and the address generator 101. And finally, the input/output means 104 receives or sends data outside the memory device under the control of the RBA controller 100 and the transmission controller 103.

As shown in FIG. 1, the address generator 101 comprises a row address generator 105 and a column address generator 106. Using an external row address signal as the starting address, the row address generator 105 generates the internal row addresses to access all continuously assigned rows. The column address generator 106 functions in a similar way to generate the internal column addresses.

The transmission controller 103 comprises an RBA selector 91, a serial register 92, and an RBA-Y decoder 93. The RBA selector 91 selects the X-axis block size of the memory cell array 102 under the control of the column address generator 106 and the RBA controller 100. The serial register 92 transmits serial data to the input/output means 104 under the control of the RBA controller 100. The RBA-Y decoder 93 decodes the Y-axis RBA data under the control of the column address generator 106 and the RBA controller 100.

The input/output means 104 comprises an input/output controller 95 and an input/output portion 94. The input/output controller 95 controls the transmission of the data from the serial register 92 to the external memory via the input/output portion 94.

As shown in FIG. 2, the RBA controller 100 comprises an X-state pointer 107, a Y-state pointer 108, a sync clock generator 109, a mode selector 110, and an internal control signal generator 111. The X-state pointer 107 increases the row address by one whenever the external system clock SC$_x$ is in synchronization with the number of columns in a block.

The Y-state pointer 108 increases the column address by one whenever there is an input from the external system clock SC$_x$. The sync clock generator 109 receives the external system clock SC$_x$ and generates a sync clock as the reference for the respective internal operations of the memory cell array 102. The mode selector 110 receives the output signals of the X- or Y-axis state pointers 107 and 108 and selects either the DRAM mode or the RBA mode. The internal control signal generator 111 generates a pulse for reading out the row and column signals, which are internally generated from the memory in order to read or write data in block units according to the usage mode.

Operation of the conventional memory device for processing digital video signals will now be described.

The processing of data is performed in block units. The standard size of a block is set to be 16 columns by 16 rows. Therefore, 256 bits of data are stored in each block.

The initial row and column address signals are generated from an external CPU (not shown) of the memory device. Then the row and column address generators 105 and 106 generate the respective internal addresses corresponding to 256 bits of data to be read or written in a block while using the initial address signals as the start address of the block. The internal row addresses are generated according to the counting state of the 4-bit X-state pointer 107 and the row address is increased by one whenever 16 system clocks are received as an input. The internal column addresses are generated according to the counting state of the 4-bit Y-state pointer 108 and the column address is increased by one whenever one system clock is received as an input.

The respective internal addresses are then given to 256 bits of data, i.e., corresponding to the size of one block, by counting the X- and Y-state pointers 107 and 108. The X- and Y-state pointers 107 and 108 are constructed to have 4-bit counters which count once whenever 16 system clocks are input to the X-axis (row), and count 16 times whenever 16 system clocks are input to the Y-axis (column).

According to the counting value of the X- and Y-state pointers 107 and 108 and externally applied signals RAS$_x$ and CAS$_x$, the internal control signal generator 111 generates control signals /RAS$_i$, /CAS$_i$, XF and RGE for operating in a mode selected via the mode selector 110, conforming to an appropriate timing. XF and RGE are signals for controlling data transmission to the serial register 92 when the data is read from or written to the memory cell array 102.

Whenever 256 system clocks required to read or write one data block are received as input, the mode selector 110 checks the external mode selection control signal to determine whether to continue the current operation mode (RBA mode) or change to a new mode. The available mode choices include the chip's operation mode, the DRAM mode, or the RBA mode.

The sync clock generator 109 generates a sync clock in synchronization with the externally applied system clock. The sync clock is used as a reference for various internal operations of the memory device.

Because the conventional memory device internally controls the processing using the X- and Y-state pointers 107 and 108 composed of 4-bit registers, the size of the block is not changeable. This limits the selection of data memory in accordance with the size of the block. In other words, such a video signal processing memory device is only compatible with external systems with a 16 columns by 16 rows block size, and not compatible with other systems.

SUMMARY OF THE INVENTION

Accordingly, the present invention is directed to a memory device and a method that substantially obviates one or more of the problems due to limitations and disadvantages of the related art.

An object of the present invention is to provide a memory device and a method for processing a digital video signal in which the block size varies in accordance with the block size of the external system to ensure the compatibility.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the invention, as embodied and broadly described, the memory device of the present invention includes a random block access (RBA) controller for generating a system control signal to thereby vary a size of the block, an address generator for receiving external address signals according to the system control signal generated by the RBA controller to thereby generate internal addresses corresponding to the size of the block, a memory cell array to which digital video signal data is written or from which digital video signal data is read according to the internal addresses generated by the address generator, a transmission controller for controlling the transmission of digital video signal data stored in the memory cell array corresponding to the internal addresses generated by the address generator, and input/output means for receiving or sending digital video signal data outside the memory device under the control of the RBA controller and the transmission controller. The RBA controller includes an X-axis varying portion for varying an X-axis size of the block, an X-state pointer for counting a varied value of a row address according to an output of the X-axis varying portion, a Y-state pointer for counting a varied value of a column address according to an internal system clock generated by the X-axis varying portion, a mode selector for selecting a usage mode according to the varied value counted by the X-state pointer and the varied value counted by the Y-axis state pointer, and an internal control signal generator for generating the system control signal to operate the memory device in the selected usage mode.

In another aspect, the memory device of the present invention includes a random block access (RBA) controller for generating a system control signal to thereby vary a size of the block, an address generator for receiving external address signals according to the system control signal generated by the RBA controller to thereby generate internal addresses corresponding to the size of the block, a memory cell array to which digital video signal data is written or from which digital video signal data is read according to the internal addresses generated by the address generator, a transmission controller for controlling the transmission of digital video signal data stored in the memory cell array corresponding to the internal addresses generated by the address generator, and input/output means for receiving or sending digital video signal data outside the memory device under the control of the RBA controller and the transmission controller.

In a further aspect, the method for processing a block of digital video signal data of the present invention includes varying at least one of an X-axis size of the block and a Y-axis size of the block and reading from or writing to a memory device digital video signal data according to the varied size of the block.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
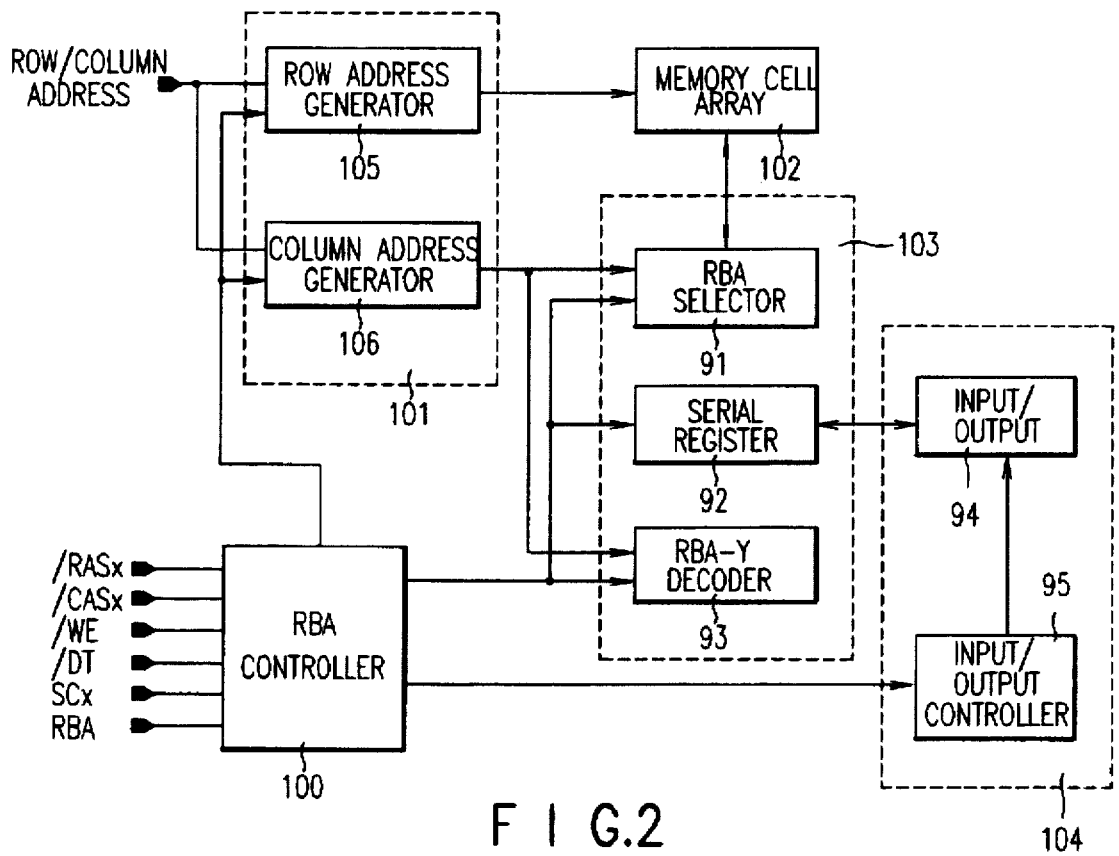
FIG. 1 is a block diagram of a conventional memory device for processing a digital video signal.
Figure 2:
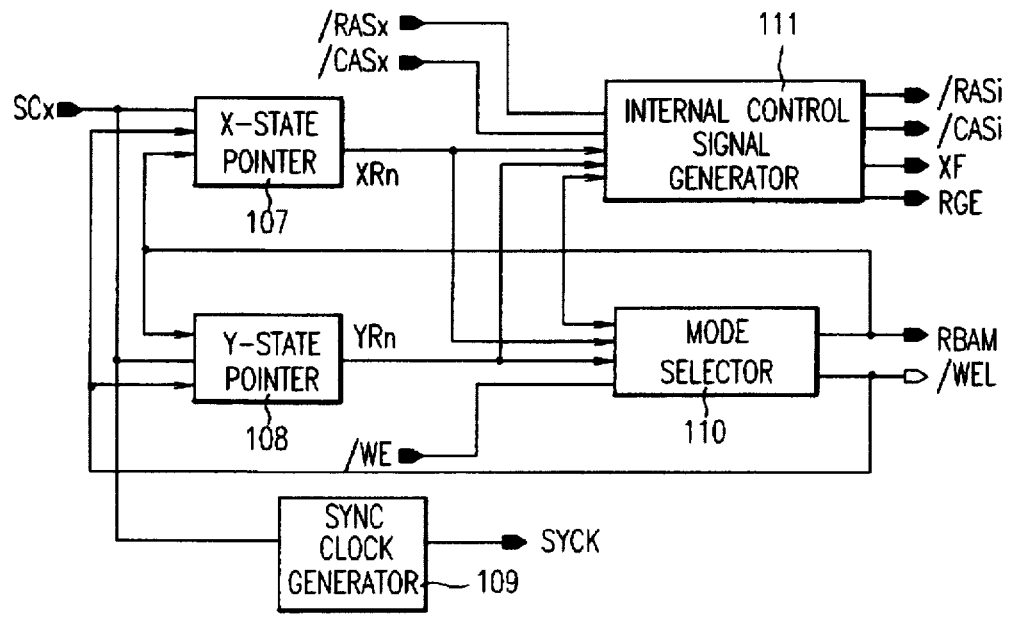
FIG. 2 is a detailed block diagram of an RBA controller applied to FIG. 1.
Figure 3:
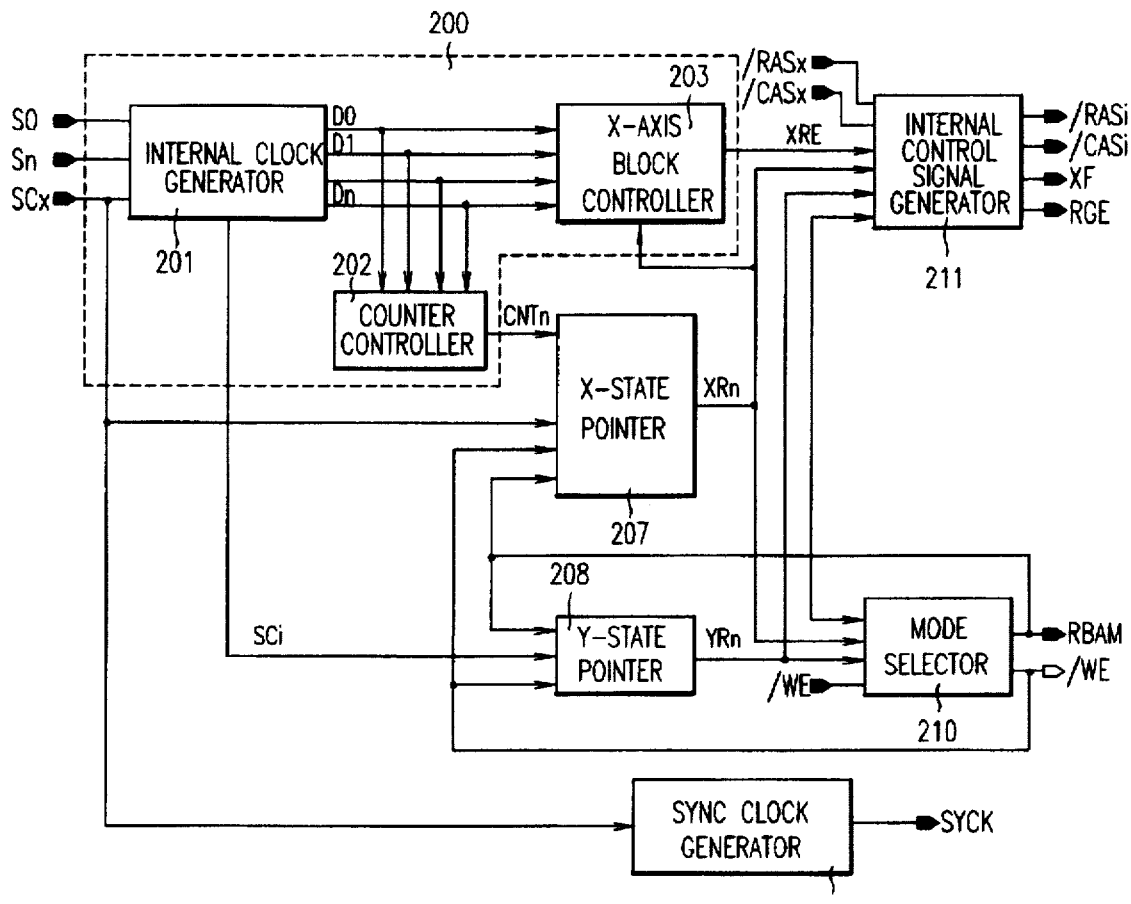
FIG. 3 is a block diagram of an RBA controller in a memory device for processing digital video signals according to the present invention where the X-axis block size is adjustable.

According to a first embodiment of the present invention as shown in FIG. 3, the RBA controller of the digital video signal processing memory device comprises an X-axis varying portion 200, an X-state pointer 207, a Y-state pointer 208, a sync clock generator 209, a mode selector 210, and an internal control signal generator 211. The X-axis varying portion 200 varies the X-axis block size. The X-state pointer 207 increases the value of the row address by one whenever the block size is in synchronization with the signal generated from the X-axis varying portion 200 and an external system clock. The Y-state pointer 208 increases the value of the column address by one whenever the block size is in synchronization with the external system clock. The sync clock generator 209 generates a sync clock SYCK in synchronization with the external system clock. It is used as a reference for the respective internal operations of the memory device. The mode selector 210 receives the output signals from the X- and Y-state pointers 207 and 208 and selects the DRAM mode or the RBA mode. The internal control signal generator 211 generates control signals /RAS$_i$, /CAS$_i$, XF, and RGE to operate in accordance with the mode selected via mode selector 210 in order to read or write data.

The X-axis varying portion 200 comprises an internal clock generator 201, a counter controller 202, and an X-axis block controller 203. After receiving the external system clock SC$_x$ and control signals S$_0$-S$_n$, which define the desired block size, the internal clock generator 201 generates block size control signals D$_0$-D$_n$ and an internal system clock SC$_i$. The counter controller 202 receives the block size control signals D$_0$-D$_n$ from the internal clock generator 201 and generates a control signal CNT$_n$, which conforms the counting range of the X-state pointer 207 to the desired block size. And finally, the X-axis block controller 203 receives the control signals D$_0$-D$_n$ from the internal clock generator 201 and the counting state of the X-state pointer 207, and sends an output control signal to the internal control signal generator 211 according to the desired X-axis block size.

Figure 4:
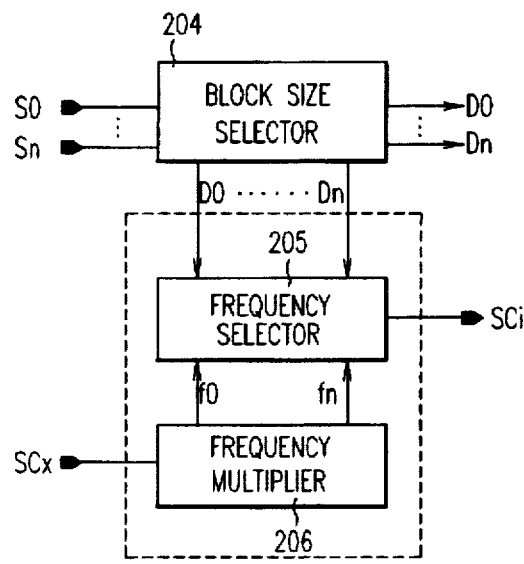
FIG. 4 is a detailed block diagram of the internal clock generator of FIG. 3.

As shown in FIG. 4, the internal clock generator 201 comprises a block size selector 204, a frequency selector 205, and a frequency multiplier 206. The block size selector 204 receives the control signals S$_0$-S$_n$, which define the desired block size, and thereby generates block size control signals D$_0$-D$_n$. The frequency selector 205 receives the control signals D$_0$-D$_n$ from the block size selector 204 and a frequency generated from the frequency multiplier 206, and produces an internal system clock SC$_i$ to be used in controlling the block size. The frequency multiplier 206 generates a frequency equivalent to $2^n$ times the frequency of the external system clock SC$_x$, and the frequency thus generated is sent to the frequency selector 205.

Operation of the first embodiment of the present invention will now be described.

First, an external no-connect (N.C.) pin of the memory device is used to receive the external control signals S$_0$-S$_n$ for selecting the block size. The N.C. pin has 4 pins, two of which are external control pins. An example involving two control signals S$_0$ and S$_1$ is discussed below with reference to FIGS. 4 and 5.

After receiving control signals S$_0$ and S$_1$, the block size selector 204 generates the control signals D$_0$-D$_3$ corresponding to the desired block size. The frequency multiplier 206, with the external system clock SC$_x$ and the sync clock of the system as inputs, generates the multiplied frequencies corresponding to the respective output ports by multiplying the system clock by $2^n$. After receiving the control signals D$_0$-D$_3$ from the block size selector 204 and the multiplied frequencies from the frequency multiplier 206, the frequency selector 205 selects the corresponding decoded multiplied frequency SC$_i$. This multiplied frequency SC$_i$ is then used as the internal system clock for the Y-state pointer 208.

Figures 6, 7:
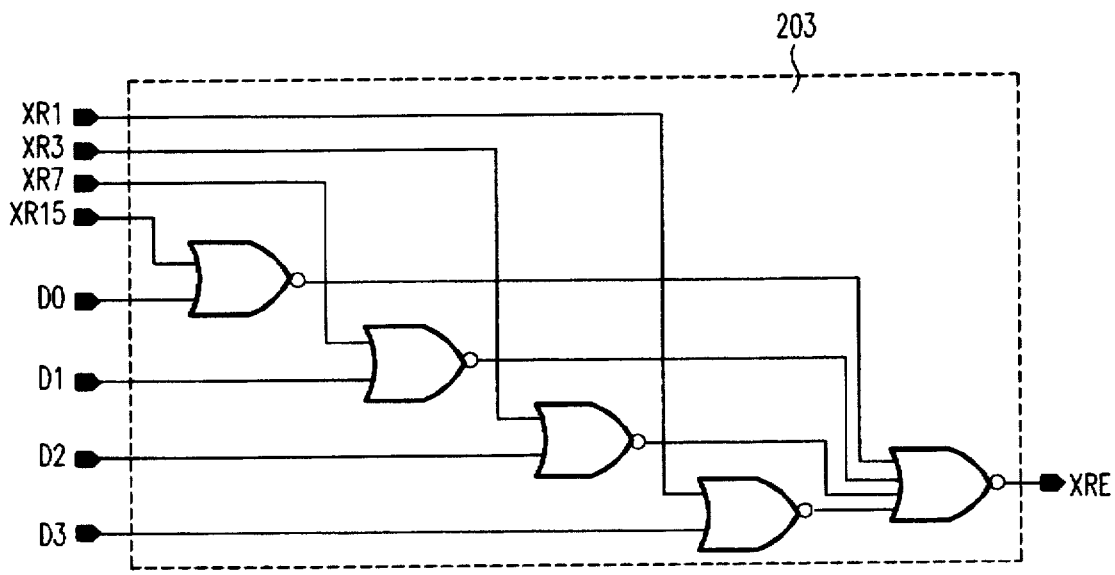
FIG. 6 is a detailed circuit diagram of the X-axis block controller of FIG. 3.
FIG. 7 is a truth table for the operation states of the respective signals in accordance with the input/output of FIG. 6.

As shown in FIG. 3, the counter controller 202 receives the control signals D$_0$-D$_3$ from the block size selector 204 and controls the X-axis counting range of the X-state pointer 207 as shown in the truth table of FIG. 7. While the X-axis block size varies, the X-state pointer 207 counts in synchronization with the external system clock SC$_x$. The Y-state pointer 208 counts in synchronization with the internal system clock SC$_i$, i.e., the multiplied frequency generated from the frequency selector 205.

The X-axis block controller 203 receives the control signals D$_0$-D$_3$ from the block size selector 204 and the counting signal from the X-state pointer 207, and generates a signal for controlling the internal control signal generator 211 according to the desired X-axis block size.

Figure 5:
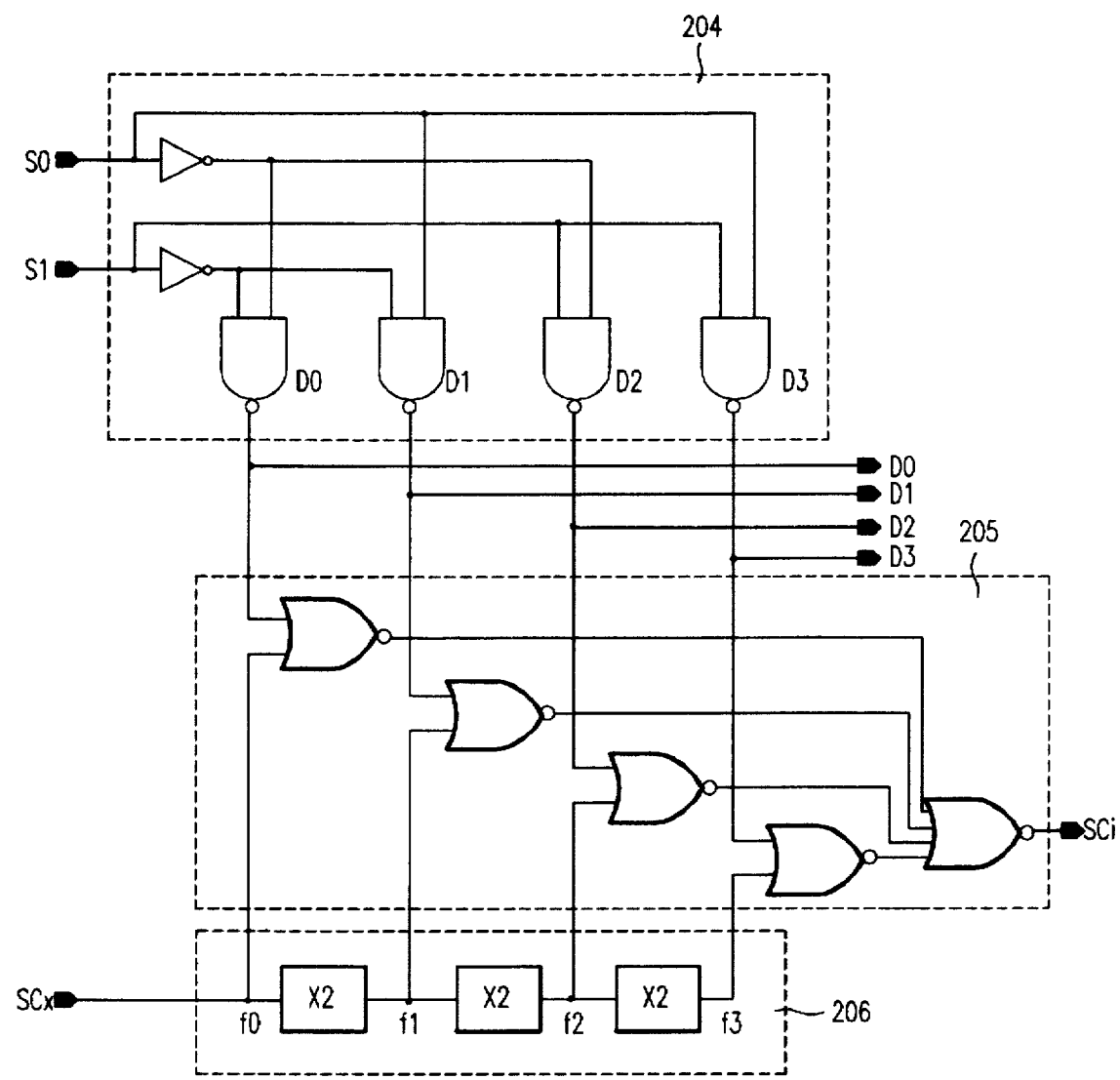
FIG. 5 is a detailed circuit diagram of the internal clock generator of FIG. 4.

FIG. 5 illustrates an example where the two control signals S$_0$ and S$_1$ are applied to the internal clock generator 201. The block size selector 204 receives the control signals S$_0$ and S$_1$, inverting the signals individually, and outputting negative logical sum signals D$_0$-D$_3$ via 4 logic gates. The frequency multiplier 206 receives the external system clock SC$_x$ and outputs four frequencies f$_0$-f$_4$ with the following values:

$$f_0 = SC_x$$
$$f_1 = 2 \times SC_x = 2 \times f_0$$
$$f_2 = 4 \times SC_x = 2 \times f_1$$
$$f_3 = 8 \times SC_x = 2 \times f_2$$

In FIG. 5, each element "X2" multiplies the input frequency by "2", as shown in the formulas above. Finally, the frequency selector 205 receives the signals D$_0$-D$_3$ from the block size selector 204 and frequencies f$_0$-f$_3$ from the frequency multiplier 206, operates via several logical gates, and outputs a negative logic sum signal SC$_i$ (used as an internal system clock).

FIG. 6 illustrates an example implementation of the X-axis block controller 203. X-axis block controller 203 receives the output signals XR$_1$, XR$_3$, XR$_7$, XR$_{15}$ of the X-state pointer 207 and the output signals D$_0$-D$_3$ of the block size selector 204, operates via several logical gates, and outputs a negative logic sum signal XRE (used as a block size control signal).

FIG. 7 illustrates various signal outputs when the control signals S$_0$ and S$_1$ are used to select the desired block size. In FIG. 7, "S$_0$" or "S$_1$" represents the value "1", and "/S$_0$" or "/S$_1$" represents the value "0". "XRE" means an enable signal and it may be XR15, XR7, XR3 or XR1, depending on which block size (for example, 16×16 bits, 8×8 bits, 4'4 bits, and 2×2 bits) is selected.

Figure 8:
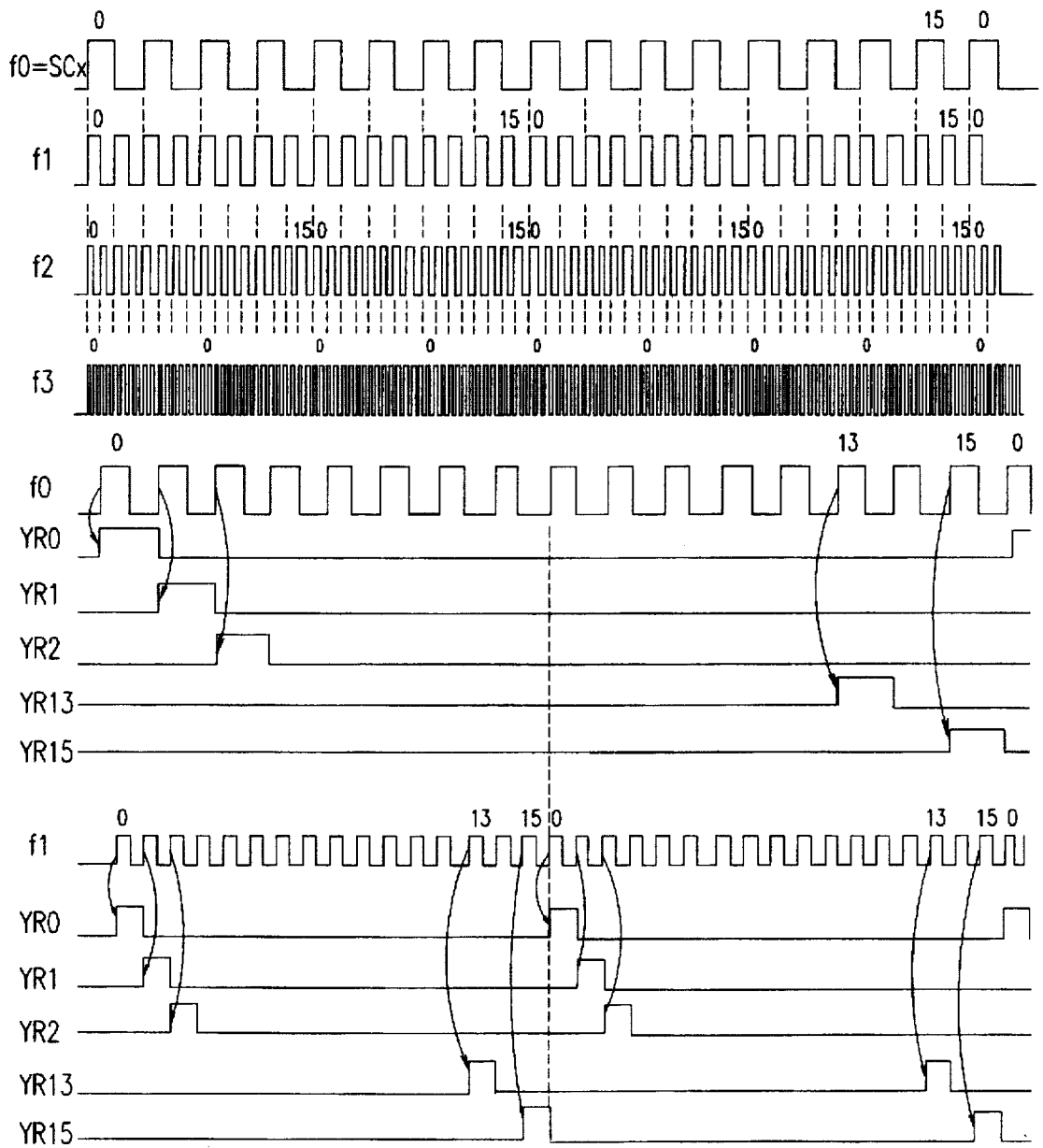
FIG. 8 is a timing diagram of the relationship between the internal clock frequency and the Y-state pointer in accordance with different block sizes (16 columns by 16 rows or 8 columns by 8 rows) of FIG. 3.

As shown in FIG. 8, when the block size is 8 columns by 8 rows, the internal clock frequency becomes $2^n$ times the frequency of the external system clock, as shown in FIGS. 5 and 7. When the block size is 16 columns by 16 rows, the operation of the Y-state pointer is performed with only half of the rate, i.e., twice as slow compared to the rate when the block size is 8 columns by 8 rows. Described in another way, whenever 16 internal clocks are input, the X-state pointer increases by one. When the X-state pointer increases by one, the Y-state pointer counts from 0 to 15.

Figure 9:
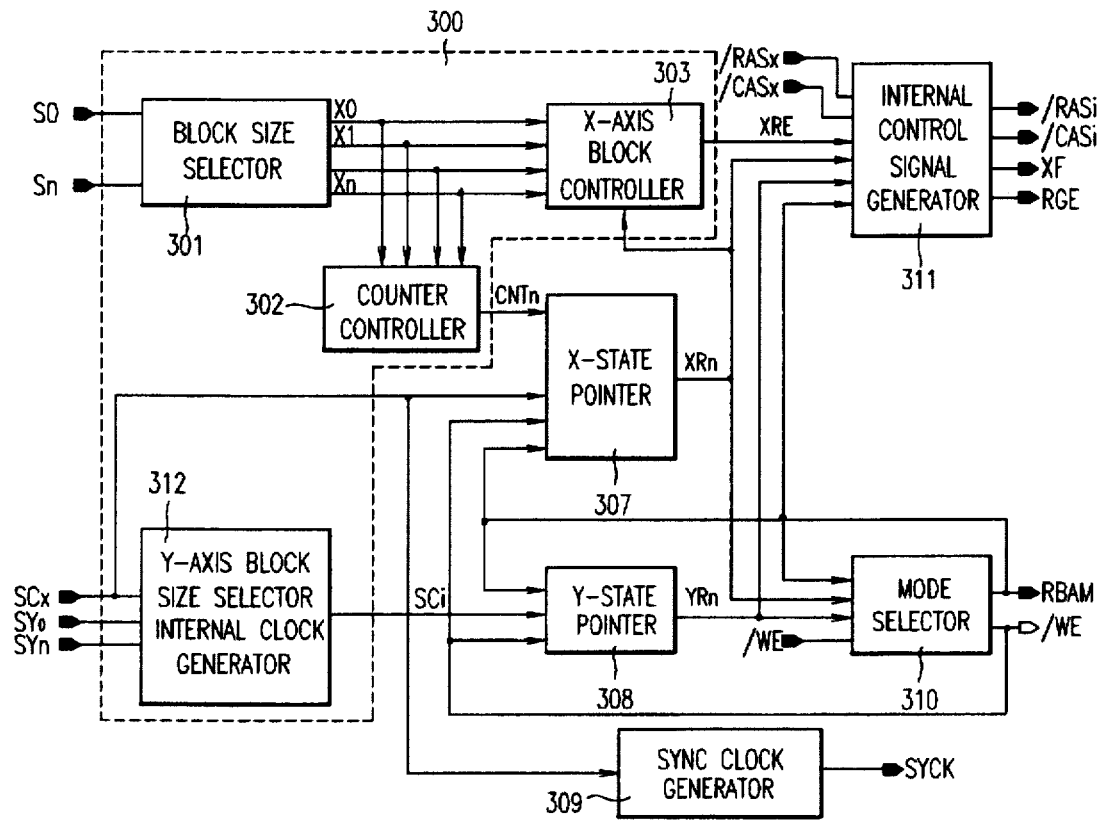
FIG. 9 is a block diagram of the RBA controller in the memory device of the present invention where the X- or Y-axis block size is adjustable.

As shown in FIG. 9, another embodiment of the RBA controller of the present invention comprises an X- and Y-axis varying portion 300, an X-state pointer 307, a Y-state pointer 308, a sync clock generator 309, a mode selector 310, and an internal control signal generator 311. The X- and Y-axis varying portion 300 sets different X- and Y-axis block sizes. The X-state pointer 307 increases the value of the row address by one in accordance with the size of a block under the control of X- and Y-axis varying portion 300. The Y-state pointer 308 increases the value of the column address by one in accordance with the size of a block under the control of X- and Y-axis varying portion 300. The sync clock generator 309 generates a sync clock SYCK as a reference for the respective internal operations of the memory device in synchronization with an external system clock. The mode selector 310 receives the output signals from the X- and Y-state pointers 307 and 308 and selects either the DRAM mode or the RBA mode. The internal control signal generator 311 generates control signals /RAS$_i$, /CAS$_i$, XF, and RGE to operate in accordance with the mode selected via mode selector 310 in order to read or write data.

The X- and Y-axis varying portion 300 comprises a block size selector 301, a counter controller 302, an X-axis block controller 303, and a Y-axis block size selector/internal clock generator 312. The block size selector 301 receives the external control signals $S_0$-$S_n$ and generates block size control signals $X_0$-$X_n$ to control the block size. The counter controller 302 receives the control signal $X_0$-$X_n$ from the block size selector 301 and generates a signal $CNT_n$ to control the counting of the X-state pointer 307 to conform to the block size. The X-axis block controller 303 receives the control signals $X_0$-$X_n$ and $XR_n$ from the block size selector 301 and the X-state pointer 307, and generates a signal XRE for controlling the internal control signal generator 311 in accordance with the X-axis block size. The Y-axis block size selector/internal clock generator 312 receives the external system clock $SC_x$ and external control signals $SY_0$-$SY_n$ for selecting the desired Y-axis block size, and also generates an internal system clock $SC_i$.

Figure 10:
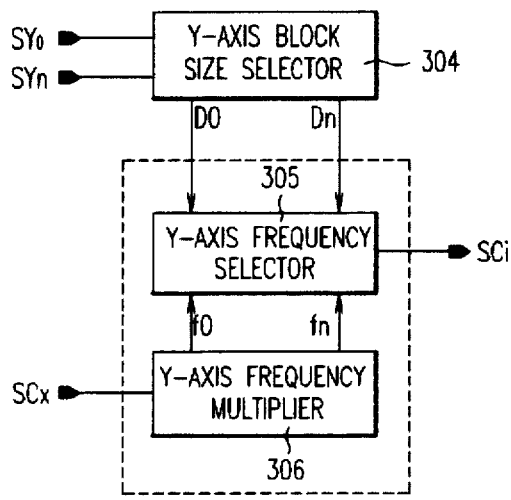
FIG. 10 is a detailed block diagram of the Y-axis block size selection/internal clock generator of FIG. 9.

As shown in FIG. 10, the Y-axis block size selector/internal clock generator 312 comprises a Y-axis block size selector 304, a Y-axis frequency selector 305, and a Y-axis frequency multiplier 306. The Y-axis block size selector 304 receives control signals $SY_0$-$SY_n$ supplied from the external control pins of the memory device to determine the Y-axis block size, and it also generates Y-axis block size control signals $D_0$-$D_n$. The Y-axis frequency selector 305 receives the control signals output from the Y-axis block size selector 304 and a frequency generated from the Y-axis frequency multiplier 306 to produce the internal system clock $SC_i$. The Y-axis frequency multiplier 306 receives the external system clock $SC_x$, generates a frequency with the value of $2^n$ times the frequency of the external system clock, and sends the result to the frequency selector 305.

Operation of the second embodiment of the present invention will now be described.

The Y-axis block size selector/internal clock generator 312 receives the external control signals $SY_0$-$SY_n$ and generates the corresponding control signals $D_0$-$D_n$ through the Y-axis block size selector 304. In synchronization with the external system clock $SC_x$, the Y-axis frequency multiplier 306 generates multiplied frequencies $f_0$-$f_n$. Finally the Y-axis frequency selector 305 generates the internal system clock $SC_i$ according to the control signals $D_0$-$D_n$ from the Y-axis block size selector 304 and the multiplied frequencies $f_0$-$f_n$ from the Y-axis frequency multiplier 306.

The Y-state pointer 308 receives the internal system clock $SC_i$ in accordance with the desired block size from the Y-axis frequency selector 305 and controls its counting range and, in turn, the Y-axis block size. The rest of the operation is the same as that of the first embodiment shown in FIG. 3.

As described above, the block size in the present invention is controlled selectively and externally. Therefore while reading or writing data during compression and expansion of digital video signals, the block size varies according to the particular external system to be used. In addition, according to the desired block size, an appropriate clock frequency is generated by an external system clock so that the memory device is capable of operating without a separate frequency generator. Thus, the block size can be varied in the present invention so that one single memory device can be used compatibly with systems having different block sizes.

It will be apparent to those skilled in the art that various modifications and variations can be made in the memory device of the present invention without departing from the spirit or scope of the invention. Thus, it is intended that the present invention cover the modifications and variations of this invention provided they come within the scope of the appended claims and their equivalents.

What is claimed is:

1. A memory device for processing a block of digital video signal data comprising:

a random block access (RBA) controller for generating a system control signal to thereby vary a size of the block from N×N to (N+N)×(N+n), where $n \geq 1$, the RBA controller including, an X-axis varying portion for varying an X-axis size of the block from N to (N+n), an X-state pointer for counting a varied value of a row address (from 1 to N+n) according to an output (N+n) of the X-axis varying portion, a Y-state pointer for counting a varied value of a column address (from 1 to N+n) according to an internal system clock generated by the X-axis varying portion, a mode selector for selecting a usage mode according to the varied value counted by the X-state pointer and the varied value counted by the Y-state pointer, and an internal control signal generator for generating the system control signal to operate the memory device in the selected usage mode;

an address generator for receiving external address signals according to the system control signal generated by the RBA controller to thereby generate internal addresses corresponding to the size of the block;

a memory cell array to which digital video signal data is written or from which digital video signal data is read according to the internal addresses generated by the address generator;

a transmission controller for controlling the transmission of digital video signal data stored in the memory cell array corresponding to the internal addresses generated by the address generator; and input/output means for receiving or sending digital video signal data outside the memory device under the control of the RBA controller and the transmission controller.

2. The memory device according to claim 1, wherein the X-axis varying portion comprises:

an internal clock generator for receiving an external system clock and external control signals to thereby generate block size control signals and the internal system clock;

a counter controller for receiving the block size control signals from the internal clock generator and generating a signal for controlling a counting range of the X-state pointer; and an X-axis block controller for controlling the internal control signal generator according to the block size control signals generated by the internal clock generator and the varied value counted by the X-state pointer.

3. A memory device for processing a block of digital video signal data comprising:

a random block access (RBA) controller for generating a system control signal to thereby vary a size of the block from N×N to (N+n)×(N+n), where $n \geq 1$, the RBA controller including, an X-axis varying portion for varying an X-axis size of the block from N to N+n, an X-state pointer for counting a varied value of a row address (from 1 to N+n) according to an output (N+n) of the X-axis varying portion, a Y-state pointer for counting a varied value of a column address (from 1 to N+n) according to an internal system clock generated by the X-axis varying portion, a mode selector for selecting a usage mode according to the varied value counted by the X-state pointer and the varied value counted by the Y-state pointer, and and internal control signal generator for generating the system control signal to operate the memory device in the selected usage mode;

an address generator for receiving external address signals according to the system control signal generated by the RBA controller to thereby generate internal addresses corresponding to the size of the block;

a memory cell array to which digital video signal data is written or from which digital video signal data is read according to the internal addresses generated by the address generator;

a transmission controller for controlling the transmission of digital video signal data stored in the memory cell array corresponding to the internal addresses generated by the address generator; and input/output means for receiving or sending digital video signal data outside the memory device under the control of the RBA controller and the transmission controller;

wherein the X-axis varying portion comprises;

an internal clock generator for receiving an external system clock and external control signals to thereby generate block size control signals and the internal system clock;

a counter controller for receiving the block size control signals from the internal clock generator and generating a signal for controlling a counting range of the X-axis state pointer; and an X-axis block controller for controlling the internal control signal generator according to the block size control signals generated by the internal clock generator and the varied value counted by the X-state pointer;

wherein the internal clock generator comprises:

a block size selector for receiving the external control signals to thereby generate the block size control signals;

a frequency multiplier for receiving the external system clock and generating multiplied frequencies; and a frequency selector for receiving the block size control signals from the block size selector and the multiplied frequencies from the frequency multiplier and producing the internal system clock.

4. The memory device according to claim 3, wherein the block size selector comprises:

a first inverting element for inverting a first external control signal;

a second inverting element for inverting a second external control signal; and a plurality of logic gates for receiving output signals of the first and the second inverting elements and for outputting negative logical sum signals.

5. The memory device according to claim 3, wherein the frequency multiplier comprises:

a first output port for multiplying the external system clock by one;

a second output port for multiplying the external system clock by two;

a third output port for multiplying the external system clock by four; and a fourth output port for multiplying the external system clock by eight.

6. The memory device according to claim 3, wherein the frequency selector comprises logic gates for receiving the block size control signals from the block size selector and the multiplied frequencies from the frequency multiplier and for outputting a negative logic sum signal.

7. The memory device according to claim 2, wherein the X-axis block controller comprises logic gates for receiving the varied value counted by the X-state pointer and the block size control signals from the block size selector to produce a negative logic sum signal, and for providing the negative logic sum signal to the internal control signal generator.

8. A memory device for processing a block of digital video signal data comprising:

a random block access (RBA) controller for generating a system control signal to thereby vary a size of the block from N×N to (N+n1)×(N+2), where n1≠n2, the RBA controller including, an X- and Y-axis varying portion for varying an X-axis size of the block from N to (N+n1) and a Y-axis size of the block from N to (N+n2), an X-state pointer for counting a varied value of a row address (from 1 to N+n1) according to an output (N+n1) of the X- and Y-axis varying portion, a Y-state pointer for counting a varied value of a column address (from 1 to N+n2) according to an internal system clock generated by the X- and Y-axis varying portion;

a sync clock generator for generating a sync clock in synchronization with an external system clock;

a mode selector for selecting a usage mode according to the varied value counted by the X-state pointer and the varied value counted by the Y-state pointer; and an internal control signal generator for generating the system control signal to operate the memory device in the selected usage mode;

an address generator for receiving external address signals according to the system control signal generated by the RBA controller to thereby generate internal addresses corresponding to the size of the block;

a memory cell array to which digital video signal data is written or from which digital video signal data is read according to the internal addresses generated by the address generator;

a transmission controller for controlling the transmission of digital video signal data stored in the memory cell array corresponding to the internal addresses generated by the address generator; and input/output means for receiving or sending digital video signal data outside the memory device under the control of the RBA controller and the transmission controller.

9. The memory device according to claim 8, wherein the X- and Y-axis varying portion comprises:

a block size selector for receiving external X-axis control signals to thereby generate X-axis block size control signals;

a counter controller for receiving the X-axis block size control signals from the block size selector and generating a signal for controlling a counting range of the X-state pointer;

an X-axis block controller for controlling the internal control signal generator according to the X-axis block size control signals generated by the block size selector and the varied value counted by the X-state pointer; and a Y-axis block size selector/internal clock generator for receiving the external system clock and external Y-axis control signals to thereby generate Y-axis block size control signals and the internal system clock.

10. A memory device for processing a block of digital video signal data comprising:

a random block access (RBA) controller for generating a system control signal to thereby vary a size of the block from N×N to (N+n1)×(N+n2), where n1≠n2, the RBA controller including, an X- and Y-axis varying portion for varying an X-axis size of the block from N to (N+n1) and a Y-axis size of the block from N to (N+n2), an X-state pointer for counting a varied value of a row address (from 1 to N+n1) according to an output (N+n1) of the X- and Y-axis varying portion, a Y-state pointer for counting a varied value of a column address (from 1 to N+n2) according to an internal system clock generated by the X- and Y-axis varying portion, a sync clock generator for generating a sync clock in synchronization with an external system clock, a mode selector for selecting a usage mode according to the varied value counted by the X-state pointer and the varied value counted by the Y-state pointer, and an internal control signal generator for generating the system control signal to operate the memory device in the selected usage mode;

an address generator for receiving external address signals according to the system control signal generated by the RBA controller to thereby generate internal addresses corresponding to the size of the block;

a memory cell array to which digital video signal data is written or from which digital video signal data is read according to the internal addresses generated by the address generator;

a transmission controller for controlling the transmission of digital video signal data stored in the memory cell array corresponding to the internal addresses generated by the address generator; and input/output means for receiving or sending digital video signal data outside the memory device under the control of the RBA controller and the transmission controller;

wherein the X- and Y-axis varying portion comprises:

a block size selector for receiving external X-axis control signals to thereby generate X-axis block size control signals;

a counter controller for receiving the X-axis block size control signals from the block size selector and generating a signal for controlling a counting range of the X-state pointer;

an X-axis block controller for controlling the internal control signal generator according to the X-axis block size control signals generated by the block size selector and the varied value counted by the X-state pointer; and a Y-axis block size selector/internal clock generator for receiving the external system clock and external Y-axis control signals to thereby generate Y-axis block size control signals and the internal system clock;

wherein the Y-axis block size selector/internal clock generator comprises:

a Y-axis block size selector for receiving the external Y-axis control signals to thereby generate the Y-axis block size control signals;

a Y-axis frequency multiplier for receiving the external system clock and generating multiplied frequencies; and a Y-axis frequency selector for receiving the Y-axis block size control signals from the Y-axis block size selector and the multiplied frequencies from the Y-axis frequency multiplier and producing the internal system clock.

11. A random block access (RBA) controller for generating a system control signal for a memory device to process a block of digital video signal data comprising:

an X-axis varying portion for varying an X-axis size of the block from N to (N+n), where n≧1;

an X-state pointer for counting a varied value of a row address (from 1 to N+n) according to a first output of the X-axis varying portion;

a Y-state pointer for counting a varied value of a column address (from 1 to N+n) according to a second output of the X-axis varying portion; and an internal control signal generator for generating the system control signal according to the varied value counted by the X-state pointer and the varied value counted by the Y-state pointer.

12. A random block access (RBA) controller for generating a system control signal for a memory device to process a block of digital video signal data comprising:

an X- and Y-axis varying portion for varying an X-axis size of the block from N to (N+n1) and a Y-axis size of the block from N to (N+n2), where n1≠n2;

an X-state pointer for counting a varied value of a row address (from 1 to N+n1) according to a first output of the X- and Y-axis varying portion;

a Y-state pointer for counting a varied value of a column address (from 1 to N+n2) according to a second output of the X- and Y-axis varying portion; and an internal control signal generator for generating the system control signal according to the varied value counted by the X-state pointer and the varied value counted by the Y-state pointer.

13. A memory device for processing a block of digital video signal data comprising:

a random block access (RBA) controller for generating a system control signal to thereby vary a size of the block from N×N to (N+n1)×(N+n2), where n1≠n2;

an address generator for receiving external address signals according to the system control signal generated by the RBA controller to thereby generate internal addresses corresponding to the size of the block (N+n1)×(N+n2);

a memory cell array to which digital video signal data is written or from which digital video signal data is read according to the internal addresses generated by the address generator;

a transmission controller for controlling the transmission of digital video signal data stored in the memory cell array corresponding to the internal addresses generated by the address generator; and input/output means for receiving or sending digital video signal data outside the memory device under the control of the RBA controller and the transmission controller.

14. The memory device according to claim 13, wherein the RBA controller comprises:

an X-axis varying portion for varying an X-axis size of the block;

an X-state pointer for counting a varied value of a row address according to a first output of the X-axis varying portion;

a Y-state pointer for counting a varied value of a column address according to a second output of the X-axis varying portion; and an internal control signal generator for generating the system control signal according to the varied value counted by the X-state pointer and the varied value counted by the Y-state pointer.

15. The memory device according to claim 13, wherein the RBA controller comprises:

an X- and Y-axis varying portion for varying an X-axis size of the block and a Y-axis size of the block;

an X-state pointer for counting a varied value of a row address according to a first output of the X- and Y-axis varying portion;

a Y-state pointer for counting a varied value of a column address according to a second output of the X- and Y-axis varying portion; and an internal control signal generator for generating the system control signal according to the varied value counted by the X-state pointer and the varied value counted by the Y-state pointer.

16. A method for generating a system control signal for controlling a memory device to process a block of digital video signal data comprising the steps of:

varying an X-axis size of the block from N×N to (N+n)×(N+n), where n≧1;

generating an internal system clock according to an external system clock;

counting a varied value of a row address (from 1 to N+n) according to the X-axis size of the block (N+n);

counting a varied value of a column address (from 1 to N+n) according to the internal system clock; and generating the system control signal according to the counted varied value of the row address and the counted varied value of the column address.

17. A method for generating a system control signal for controlling a memory device to process a block of digital video signal data comprising the steps of:

varying an X-axis size of the block from N to (N+n1) and a Y-axis size of the block from N to (N+n2), where n1≠n2;

generating an internal system clock according to an external system clock and the Y-axis size of the block;

counting a varied value of a row address (from 1 to N+n1) according to the X-axis size of the block (N+n1);

counting a varied value of a column address (form 1 to N+n2) according to the internal system clock; and generating the system control signal according to the counted varied value of the row address and the counted varied value of the column address.

18. A method for processing a block of digital video signal data comprising the steps of:

generating a system control signal to thereby vary a size of the block from N×N to (N+n1)×(N+n2), where n1≠n2;

receiving external address signals according to the system control signal to thereby generate internal addresses corresponding to the size of the block (N+n1)×(N+n2);

reading digital video signal data from or writing digital video signal data to a memory cell array according to the internal addresses;

controlling the transmission of digital video signal data stored in the memory cell array corresponding to the internal addresses; and receiving or sending digital video signal data outside a memory device under the control of the system control signal.

19. The method according to claim 18, wherein the step of generating the system control signal comprises the steps of:

varying an X-axis size of the block;

generating an internal system clock according to an external system clock;

counting a varied value of a row address according to the X-axis size of the block;

counting a varied value of a column address according to the internal system clock; and generating the system control signal according to the counted varied value of the row address and the counted varied value of the column address.

20. The method according to claim 18, wherein the step of generating the system control signal comprises the steps of:

varying an X-axis size of the block and a Y-axis size of the block;

generating an internal system clock according to an external system clock and the Y-axis size of the block;

counting a varied value of a row address according to the X-axis size of the block;

counting a varied value of a column address according to the internal system clock; and generating the system control signal according to the counted varied value of the row address and the counted varied value of the column address.

21. A method for processing a block of digital video signal data comprising the steps of:

varying at least one of an X-axis size of the block from N to (N+n1) and a Y-axis size of the block from N to (N+n2), where n1≠n2; and reading digital video signal data from or writing digital video signal data to a memory device according to the varied size of the block (N+n1)×(N+n2).

* * * * *

UNITED STATES PATENT AND TRADEMARK OFFICE
CERTIFICATE OF CORRECTION

PATENT NO. : 5,706,480
DATED : January 6, 1998
INVENTOR(S) : Dae Sik KIM

It is certified that error appears in the above-identified patent and that said Letters Patent is hereby corrected as shown below:

Column 8, line 6, change "(N+N)" to --(N+n)--.

Column 9, line 5, change "and internal" to --an internal--.

Column 10, line 15, change "(N+2)" to --(N+n2)--.

Signed and Sealed this

Sixth Day of April, 1999

Attest:

Q. TODD DICKINSON

*Attesting Officer*        *Acting Commissioner of Patents and Trademarks*